United States Patent
Takano et al.

(10) Patent No.: US 10,587,227 B2
(45) Date of Patent: Mar. 10, 2020

(54) AMPLIFIER AND ELECTRONIC CIRCUIT

(71) Applicant: Sony Corporation, Tokyo (JP)

(72) Inventors: Hideyuki Takano, Kanagawa (JP); Fumitaka Kondo, Kanagawa (JP); Norio Shoji, Kanagawa (JP)

(73) Assignee: Sony Corporation, Tokyo (JP)

( * ) Notice: Subject to any disclaimer, the term of this patent is extended or adjusted under 35 U.S.C. 154(b) by 254 days.

(21) Appl. No.: 15/554,366

(22) PCT Filed: Feb. 3, 2016

(86) PCT No.: PCT/JP2016/053237
§ 371 (c)(1),
(2) Date: Aug. 29, 2017

(87) PCT Pub. No.: WO2016/152267
PCT Pub. Date: Sep. 29, 2016

(65) Prior Publication Data
US 2019/0158032 A1  May 23, 2019

(30) Foreign Application Priority Data
Mar. 24, 2015 (JP) ................... 2015-060619

(51) Int. Cl.
*H03F 3/18* (2006.01)
*H03F 1/26* (2006.01)
(Continued)

(52) U.S. Cl.
CPC .............. *H03F 1/26* (2013.01); *H03F 3/189* (2013.01); *H03F 3/193* (2013.01); *H03F 3/21* (2013.01);
(Continued)

(58) Field of Classification Search
CPC ........ H03F 1/26; H03F 3/45224; H03F 3/193; H03F 3/21; H03F 3/30; H03F 3/189;
(Continued)

(56) References Cited

U.S. PATENT DOCUMENTS 4,689,607 A * 8/1987 Robinson .............. H03M 1/447
323/315
5,838,193 A * 11/1998 Myers .................... H03F 3/2171
330/10

(Continued)

FOREIGN PATENT DOCUMENTS

| JP | 10-063756 A | 3/1998 |
| JP | 2006-060606 A | 3/2006 |

*Primary Examiner* — Khanh V Nguyen
(74) *Attorney, Agent, or Firm* — Michael Best & Friedrich LLP

(57) ABSTRACT

In an amplifier that uses a transistor, a minimum operation voltage is lowered.

An amplifier includes a P-type transistor and an N-type transistor connected in series, and an operational amplifier. An output terminal of the operational amplifier is connected to gates of both the P-type transistor and the N-type transistor. One of an inverting input terminal and a non-inverting input terminal of the operational amplifier is connected to drains of both the P-type transistor and the N-type transistor. Further, a predetermined reference voltage is applied to another of the inverting input terminal and the non-inverting input terminal.

9 Claims, 14 Drawing Sheets

(51) Int. Cl.
  *H03F 3/189* (2006.01)
  *H03F 3/30* (2006.01)
  *H03F 3/193* (2006.01)
  *H03F 3/21* (2006.01)
  *H03F 3/45* (2006.01)

(52) U.S. Cl.
  CPC ........... *H03F 3/30* (2013.01); *H03F 3/45224* (2013.01); *H03F 2200/234* (2013.01); *H03F 2200/294* (2013.01); *H03F 2200/372* (2013.01)

(58) Field of Classification Search
  CPC ......... H03F 2200/372; H03F 2200/294; H03F 2200/234; H03F 3/3066; H03F 1/307; H03F 1/34
  USPC .......................................... 330/85, 265, 291
  See application file for complete search history.

(56) References Cited

U.S. PATENT DOCUMENTS

| | | | | |
|---|---|---|---|---|
| 6,441,685 B1* | 8/2002 | MacMillan | ........... | H03F 3/2171 330/10 |
| 6,940,353 B2* | 9/2005 | Moraveji | .............. | H03F 1/0261 330/264 |
| 7,130,412 B2* | 10/2006 | Joffe | .................. | H04M 19/005 379/387.01 |
| 8,725,105 B2* | 5/2014 | Tsai | ........................ | H03F 3/193 330/253 |
| 8,791,755 B2* | 7/2014 | Giotta | ................. | H03F 3/45475 330/10 |

\* cited by examiner

AMPLIFIER AND ELECTRONIC CIRCUIT

TECHNICAL FIELD

The present technology relates to an amplifier and an electronic circuit. Specifically, the present technology relates to an amplifier that amplifies a signal with a transistor and an electronic circuit.

BACKGROUND ART

In related art, in a receiver or the like of a radio signal, an amplifier is used to amplify a faint signal. The amplifier is generally disposed on a first stage of a receiver, and a gain thereof and a noise figure thereof give a large influence on a reception sensitivity of a radio signal. Here, a noise figure is a ratio between an S/N (Signal to Noise) ratio of an input signal to an amplifier and an S/N ratio of an output signal to an amplifier. Normally, the larger a gain of an amplifier, the higher a reception sensitivity becomes. Further, the smaller a noise figure, the higher a reception sensitivity becomes. To improve characteristics of the gain and the like, for example, an amplifier has been proposed in which a P-type transistor and an N-type transistor for amplifying a signal are connected to a power supply in series (see, for example, Patent Literature 1).

CITATION LIST

Patent Literature

Patent Literature 1: Japanese Patent Application Laid-open No. 2006-60606

DISCLOSURE OF INVENTION

Technical Problem

In the amplifier described above, the two transistors are provided, so the characteristics of the gain, noise figure, and the like can be improved as compared to an amplifier having only one transistor. However, a minimum operation voltage is increased instead, and thus there arises a problem in that power consumption associated therewith can be increased. In this amplifier, when a saturation drain voltage of the transistor is represented as $V_{sat}$, and a threshold voltage is represented as $V_T$, a minimum operation voltage becomes $2V_{SAT}+V_T$. Under a condition of a low voltage of $2V_{sat}$, for example, the minimum operation voltage is higher than the voltage by a voltage of $V_T$, so an operation cannot be carried out.

The present technology has been made in view of the circumstances as described above, and has an object to reduce a minimum operation voltage in an amplifier that uses a transistor.

Solution to Problem

The present technology has been made to solve the problems described above. According to a first aspect of the present technology, there is provided an amplifier including a P-type transistor and an N-type transistor connected in series, and an operational amplifier, in which an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal. As a result, the one of the inverting input terminal and the non-inverting input terminal of the operational amplifier and the output terminal is connected, and an effect that virtual short-circuiting is performed between the inverting input terminal and the non-inverting input terminal is produced.

Further, in the first aspect, the amplifier may further include a bias voltage supply unit that supplies a predetermined bias voltage to the gate of one of the P-type transistor and the N-type transistor, and a capacitor inserted between the gate of the P-type transistor and the gate of the N-type transistor. As a result, an effect that an independent bias voltage is applied to the gate of the one of the P-type transistor and the N-type transistor is produced.

Further, in the first aspect, the amplifier may further include a current source connected to the drain. As a result, an effect that a current is supplied to the current source is produced.

Further, in the first aspect, the amplifier may further include a cascade transistor device inserted between the drain and the current source. As a result, an effect that a parasitic capacitance of the drain is decreased is produced.

Further, in the first aspect, the amplifier may further include a comparator that compares a potential of the gate and a predetermined potential and supplies a result of the comparison, in which the current source may supply the predetermined current on a basis of the comparison result of the comparator. As a result, an effect that the current is supplied on a basis of the comparison result of the comparator is produced.

Further, in the first aspect, the amplifier may further include a low-pass filter. The current source may include a transistor, and the low-pass filter may supply a DC bias voltage to a gate terminal of the transistor. As a result, an effect that only the DC bias voltage is supplied to the gate terminal of the transistor, and the transistor functions as only a DC current source is produced.

Further, in the first aspect, the amplifier may further include an impedance matching circuit that causes impedances of circuits on both ends of a transmission channel connected to the amplifier to match with each other. As a result, an effect that the impedances of the circuits on both ends of the transmission channel are matched with each other is produced.

Further, in the first aspect, the predetermined reference voltage is a value equal to or more than a saturation drain voltage of one of the P-type transistor and the N-type transistor. As a result, an effect that the P-type transistor and the N-type transistor operate in a saturation area is produced.

Further, according to a second aspect of the present technology, there is provided an electronic circuit including as amplifier and a signal processing unit. The amplifier includes a P-type transistor and an N-type transistor connected in series and an operational amplifier, in which an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal. The signal processing unit, processes a signal output from the drain. AS a result, the one of the inverting input terminal and the non-inverting input terminal of the operational amplifier and the output terminal is connected, and an effect that virtual short-circuiting is performed between the inverting input terminal and the non-inverting input terminal is produced.

Further, in the second aspect, the electronic circuit may further include: a bias voltage supply unit that supplies a bias voltage having a value indicated by a control signal to the gate of one of the P-type transistor and the N-type transistor; and a capacitor inserted between the gate of the P-type transistor and the gate of the N-type transistor. An effect that an independent bias voltage is applied to the gate of one of the P-type transistor and the N-type transistor is produced.

Further, in the second aspect, the signal processing unit may process a signal output from the drain and generates the control signal on a basis of a level of the signal. As a result, an effect that the control signal is generated on a basis of the level of the signal is produced.

Advantageous Effects of Invention

According to the present technology, in the amplifier that uses the transistor, it is possible to exert an excellent effect that the minimum operation voltage can be reduced. It should be noted that, the effects described herein are not necessarily limited, and any of the effects described in this disclosure may be obtained.

FIG. A flowchart showing an example of an operation of the radio receiver in the second embodiment.

Figure 8:
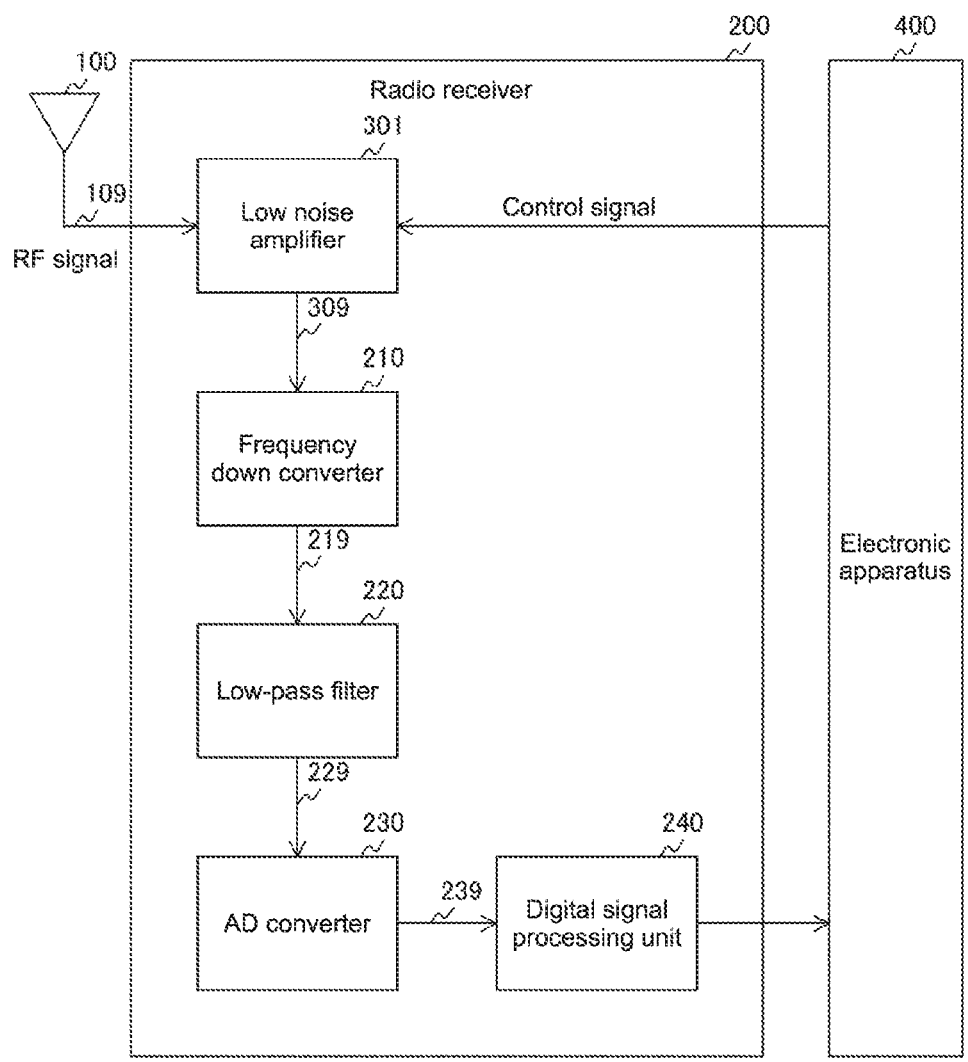

FIG. 8 A block diagram showing a configuration example of a radio receiver in a modified example of the second embodiment.

Figure 9:
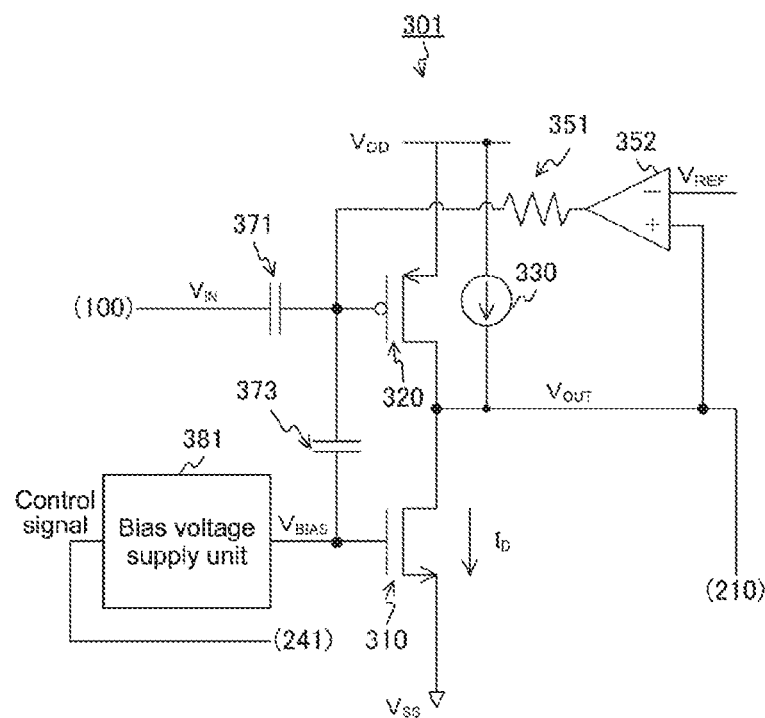

FIG. 9 A circuit diagram showing a configuration example of a low noise amplifier in a third embodiment.

Figure 10:
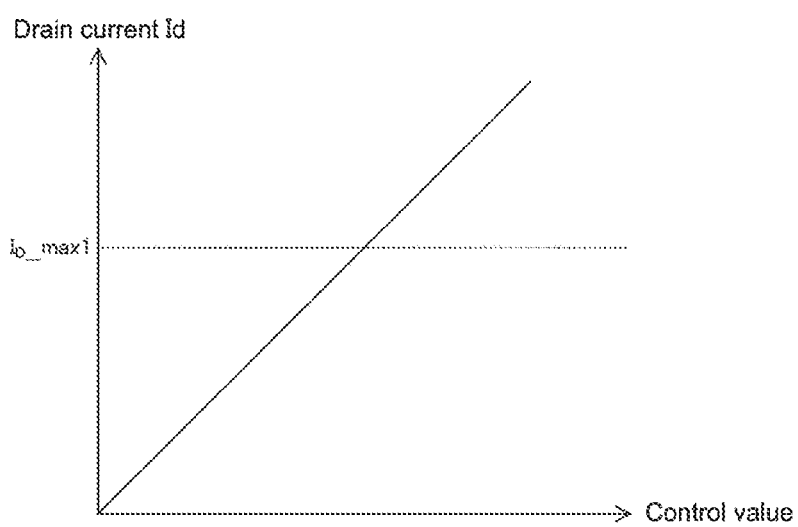

FIG. 10 A graph showing an example of a drain current for each control value in the third embodiment.

Figure 11:
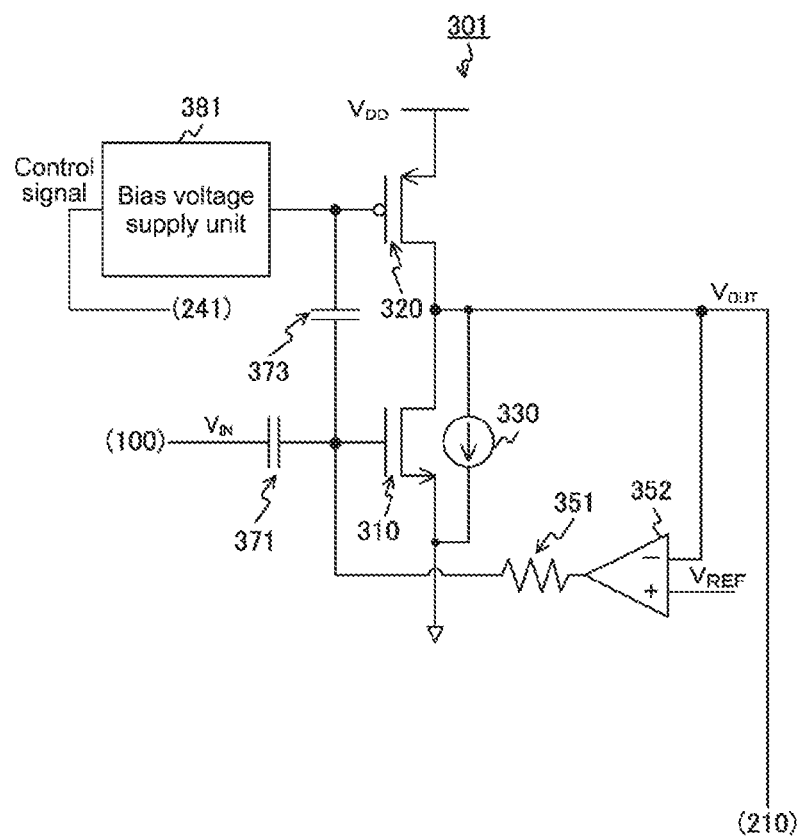

FIG. 11 A circuit diagram showing a configuration example of a low noise amplifier in a modified example of the third embodiment.

Figure 12:
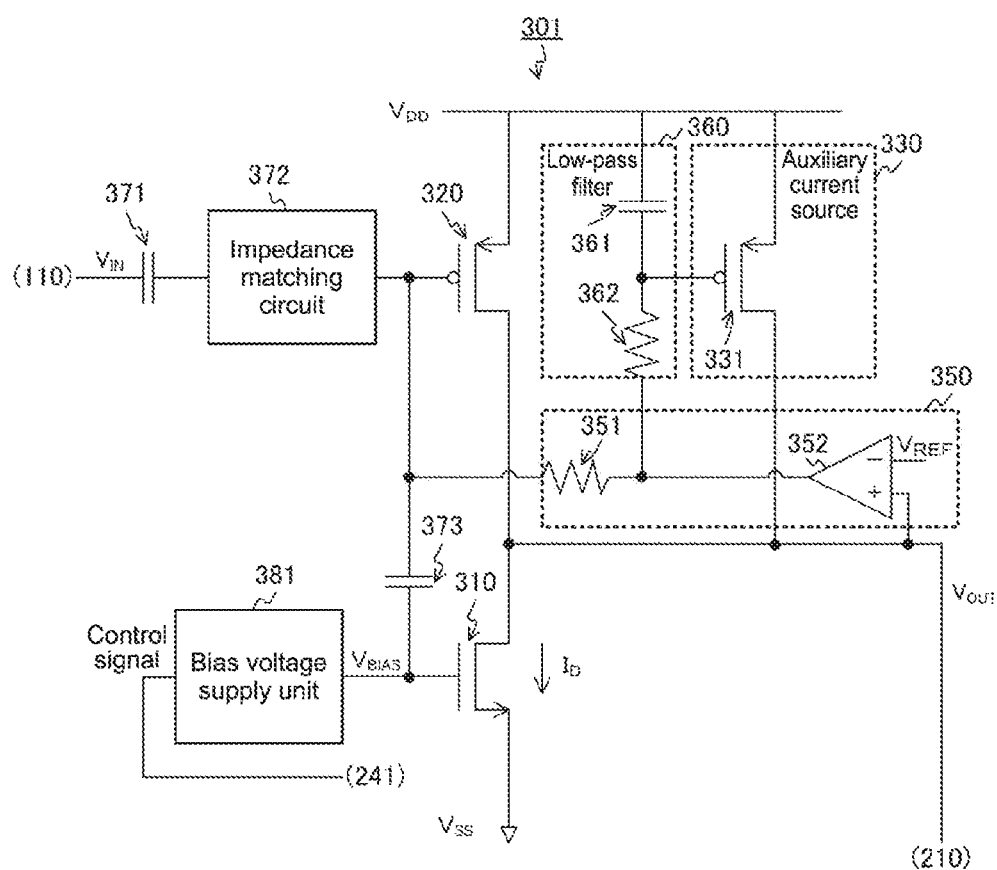

FIG. 12 A circuit diagram showing a configuration example of a low noise amplifier is a fourth embodiment.

Figure 13:
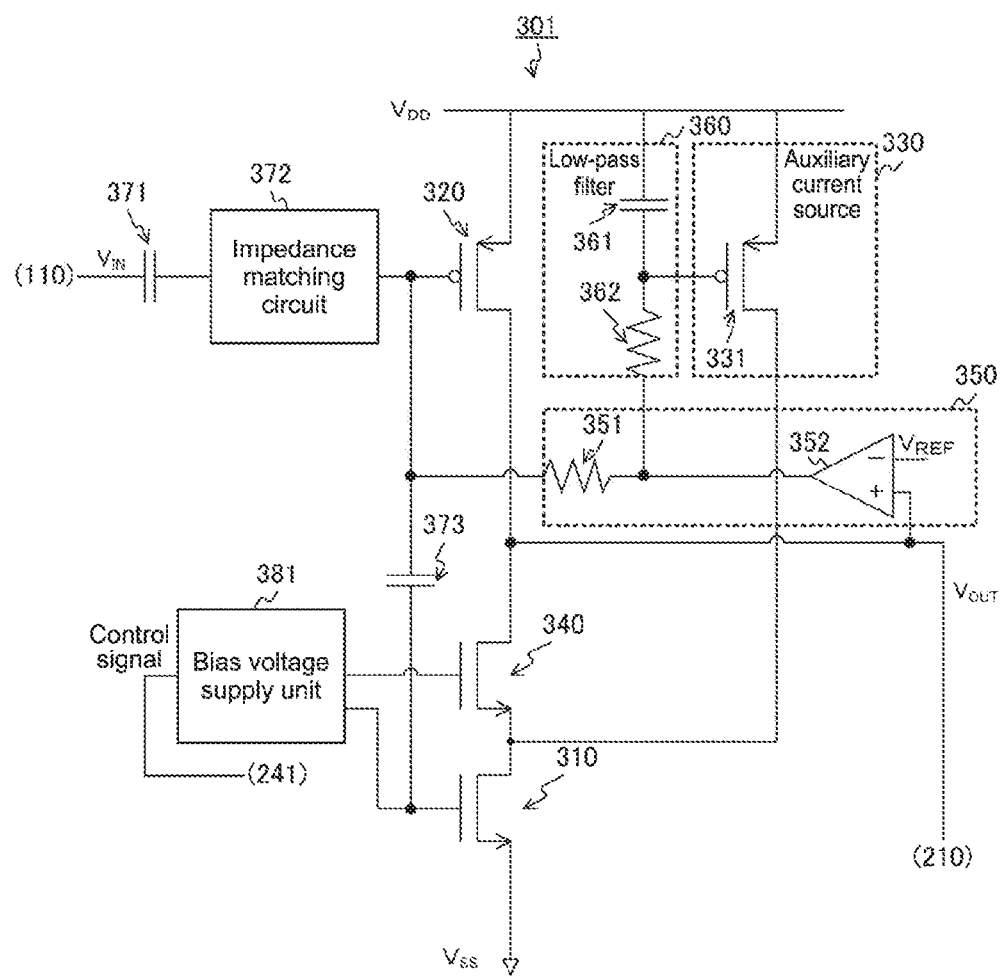

FIG. 13 A circuit diagram showing a configuration example of a low noise amplifier in a first modified example of the fourth embodiment.

Figure 14:
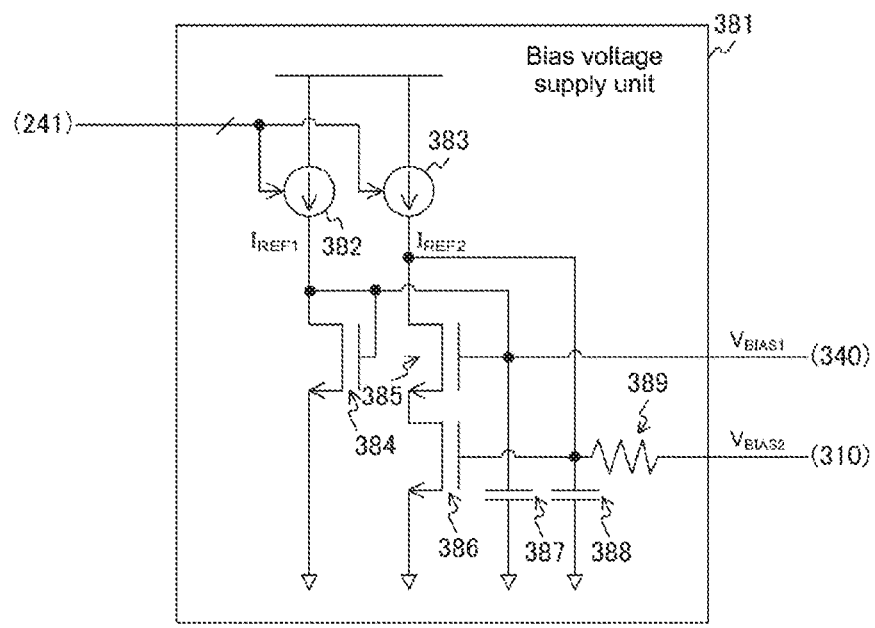

FIG. 14 A circuit diagram showing a configuration example of a bias voltage supply unit in the first modified example of the fourth embodiment.

Figure 15:
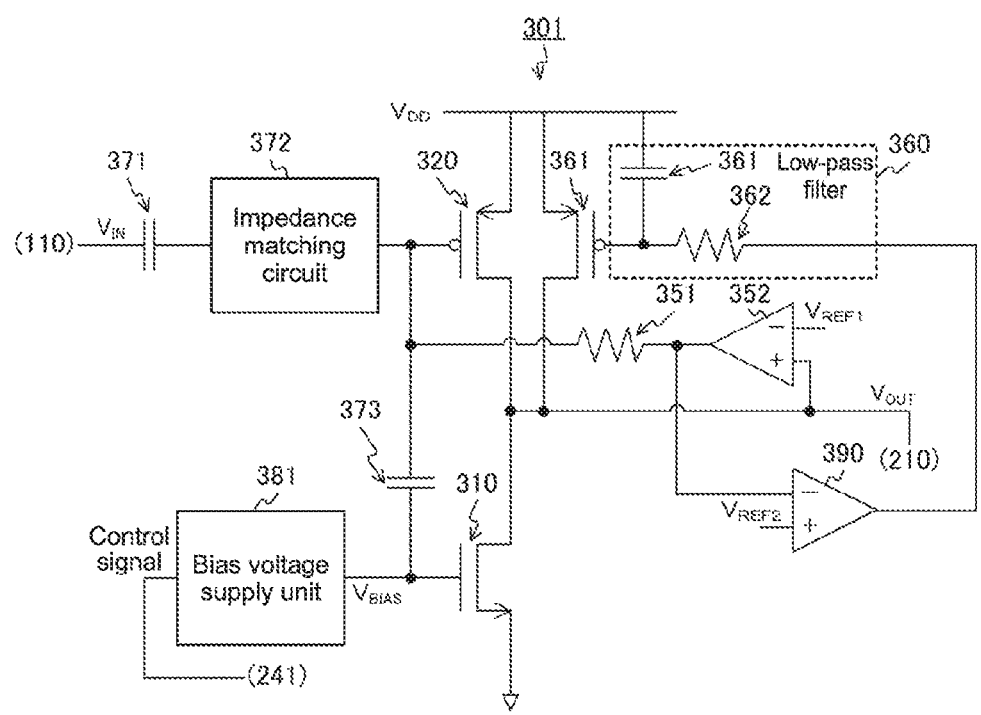

FIG. 15 A circuit diagram showing a configuration example of a low noise amplifier in a second modified example of the fourth embodiment.

MODE(S) FOR CARRYING OUT THE INVENTION

Hereinafter, modes for carrying out the present technology (hereinafter, referred to as embodiments) will be described. Description will be given in the following order.
1. First embodiment (example in which virtual short-circuiting is performed between terminals of operational amplifier)
2. Second embodiment (example in which virtual short-circuiting is performed between terminals of operational amplifier and bias voltage is controlled)
3. Third embodiment (example in which auxiliary current is supplied, and virtual short-circuiting is performed between terminals of operational amplifier)
4. Fourth embodiment (example in which low-pass filter is provided, and virtual short-circuiting is performed between terminals of operational amplifier)

<1. First Embodiment>
[Configuration Example of Radio Receiver]

Figure 1:
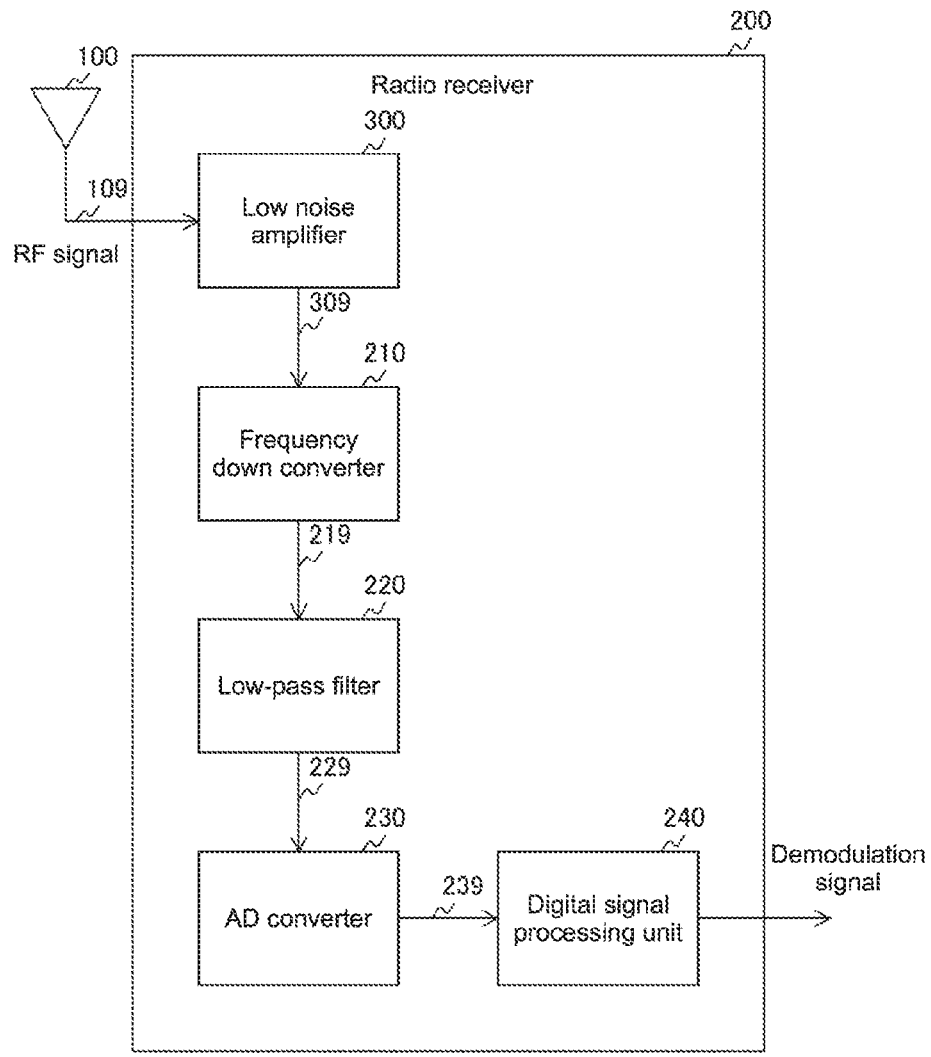
FIG. 1 A block diagram showing a configuration example of a radio receiver in a first embodiment.

FIG. 1 is a block diagram showing a configuration example of radio receiver 200 in the first embodiment. The radio receiver 200 receives an RF (Radio Frequency) signal, and is provided with a low noise amplifier 300, a frequency down converter 210, and a low-pass filter 220. Further, the radio receiver 200 is provided with an AD (Analog to Digital) converter 230 and a digital signal processing unit 240. Further, to the radio receiver 200, an antenna 100 is connected. It should be noted that a circuit in the radio receiver 200 is an example of an electronic circuit described in the claims.

The antenna 100 converts a radio wave into an RF signal and supplies the signal to the low noise amplifier 300 through a signal line 109. The low noise amplifier 300 amplifies the RF signal and supplies the signal to the frequency down converter 210 through a signal line 309. It should be noted that the low noise amplifier 300 is an example of an amplifier described in the claims.

The frequency down converter 210 converts the RF signal to a signal (baseband signal or the like) having a lower frequency than the RF signal. The frequency down converter 210 supplies the converted baseband signal to the AD converter 230 through a signal line 219.

The AD converter 230 converts an analog baseband signal to a digital signal and supplies the signal to the digital signal processing unit 240 through a signal line 239.

The digital signal processing unit 240 performs a predetermined signal processing such as a demodulation process for the digital signal. The digital signal processing unit 240 outputs the processed demodulation signal to an external apparatus. It should be noted that the digital signal processing unit is an example of a signal processing unit described in the claims.

It should be noted that the low noise amplifier 300 is provided to the radio receiver 200, but the low noise amplifier 300 may be provided on an apparatus (radio transmitter, acoustic equipment, or the like) other than the radio receiver 200.

[Configuration Example of Low Noise Amplifier]

Figure 2:
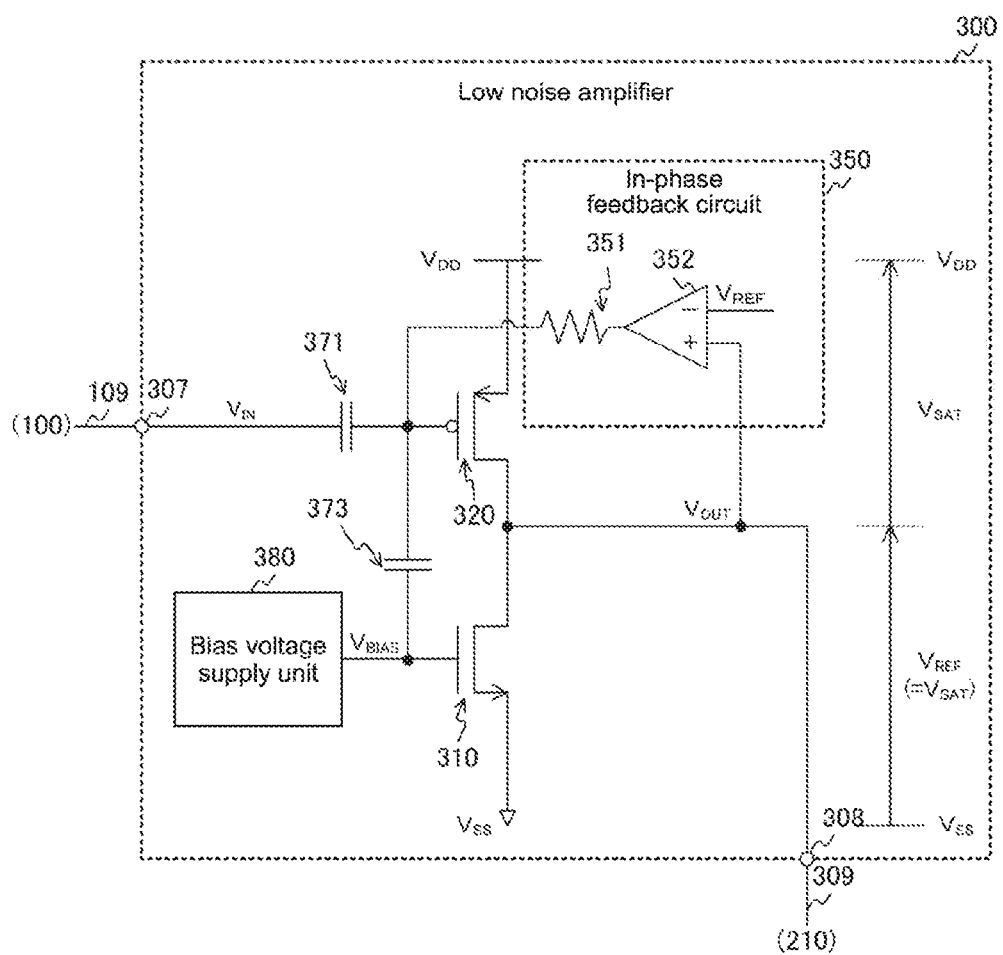
FIG. 2 A circuit diagram showing a configuration example of a low noise amplifier in the first embodiment.

FIG. 2 is a circuit diagram showing a configuration example of the low noise amplifier 300 in the first embodiment. The low noise amplifier 300 is provided with an input terminal 307, an output terminal 308, an in-phase feedback circuit 350, a capacitor 371, a capacitor 373, a bias voltage supply unit 380, a P-type transistor 320, and an N-type transistor 310. The in-phase feedback circuit 350 is provided with a resistance 351 and an operational amplifier 352. As the P-type transistor 320 and the N-type transistor 310, for example, a MOS transistor is used.

The input terminal 307 is connected to the antenna 100. An end of the capacitor 371 is connected to the input terminal 307, and the other end thereof is connected to the capacitor 373, a gate of the P-type transistor 320, and the resistance 351. The capacitor 373 is inserted between the gate of the P-type transistor 320 and a gate of the N-type transistor 310. The P-type transistor 320 and the N-type transistor 310 are connected to a power supply terminal in series.

Further, both drains of the P-type transistor 320 and the N-type transistor 310 are connected to a non-inverting input terminal (+) of the operational amplifier 352 and the output terminal 308. To an inverting input terminal (−) of the operational amplifier 352, a predetermined reference voltage $V_{REF}$ is applied, and an output terminal of the operational amplifier 352 is connected to the gate of the P-type transistor 320 through the resistance 351. The output terminal 308 is connected to the frequency down converter 210.

Here, the reference voltage $V_{REF}$ is set to a value equal to or more than the saturation drain voltage $V_{SAT}$ of the P-type transistor 320 or the N-type transistor 310, for example. It should be noted that the P-type transistor 320 and the N-type transistor 310 have the same saturation drain voltage.

The bias voltage supply unit 380 supplies a certain bias voltage $V_{BIAS}$ to the gate of the N-type transistor 310. The bias voltage $V_{BIAS}$ is set to a value that satisfies the following expression. Here, the unit of the bias voltage $V_{BIAS}$ is, for example, volt (V). Hereinafter, the same holds true for units of voltages other than the bias voltage $V_{BIAS}$.

$$V_T < V_{BIAS} < V_{SAT} + V_T \qquad \text{expression 1}$$

In the above expression, $V_T$ is a threshold voltage of the N-type transistor 310. It should be noted that the P-type transistor 320 and the N-type transistor 310 have the same threshold voltage.

In the above configuration, the capacitor 371 cuts a DC component of the RF signal and inputs an AC signal component to the P-type transistor 320 or the like. The assumption is made that the signal component is faint, and a potential of the gate of the P-type transistor 320 is at a low level. In this case, the P-type transistor 320 is shifted to an on state and operates in a saturation area. On the other hand, the N-type transistor 310 is also shifted to an on state because of application of the bias voltage $V_{BIAS}$ thereto. The P-type transistor 320 and the N-type transistor 310 amplify the signal component.

Here, in order to cause the N-type transistor 310 and the P-type transistor 320 to operate in the on state, a power supply voltage $V_{DD}$ of a power supply terminal has to satisfy the following expression.

$$V_{DD} - V_{OUT} \geq V_{SAT} \qquad \text{expression 2}$$

In the above expression, $V_{OUT}$ is an output voltage from drains of the P-type transistor 320 and the N-type transistor 310.

Further, in a case where the P-type transistor 320 is in the on state, the output terminal of the operational amplifier 352 is connected to the non-inverting input terminal (+) through the P-type transistor 320, and virtual short-circuiting is conducted between the non-inverting input terminal (+) and the inverting input terminal (−). As a result, the voltage of the non-inverting input terminal (+) and the voltage of the inverting input terminal (−) are equal to each other, so the following expression is established.

$$V_{OUT} = V_{REF} \qquad \text{expression 3}$$

In a case where the saturation drain voltage $V_{SAT}$ is set to reference voltage $V_{REF}$ of the above expression, the above expression can be replaced with the following expression.

$$V_{OUT} = V_{SAT} \qquad \text{expression 4}$$

When the expression 4 is assigned to the expression 2, the following expression can be obtained.

$$V_{DD} \geq 2V_{SAT} \qquad \text{expression 5}$$

From the above expression, a minimum operation voltage of the low noise amplifier 300 is $2V_{SAT}$.

Here, if the in-phase feedback circuit 350 is not provided as described in Patent Literature 1, the power supply voltage $V_{DD}$ has to satisfy the following expression.

$$V_{DD} \geq 2V_{SAT} + V_T \qquad \text{expression 6}$$

From the above expression, in a case where the in-phase feedback circuit 350 is not provided, a minimum operation voltage is $2V_{SAT} + V_T$. For example, in a case where the saturation drain voltage $V_{SAT}$ is 0.2 V, and the threshold voltage $V_T$ is 0.4 V, the minimum operation voltage is 0.8 V. In contrast, in the low noise amplifier 300 in which the in-phase feedback circuit 350 is provided, from the expression 5, the minimum operation voltage is $2V_{SAT}$ (=0.4 V). This is much lower than 0.8 V in the case of not providing the in-phase feedback circuit 350. In an actual circuit, a value obtained by adding a margin to a logical minimum operation voltage ($2V_{SAT}$) is used as the power supply voltage $V_{DD}$. However, even in consideration of the margin, it is possible to cause the low noise amplifier 300 to operate under a voltage of 0.6 V or 0.7 V.

It should be noted that the capacitor 371 for cutting the DC component is provided in the low noise amplifier 300, but the capacitor 371 may be provided outside the low noise amplifier 300. In this case, for example, between the low noise amplifier 300 and the antenna 100, the capacitor 371 is inserted.

Further, the bias voltage supply unit 380 is provided in the low noise amplifier 300, but the bias voltage supply unit 380 may be provided outside the low noise amplifier 300. Further, the bias voltage $V_{BIAS}$ is applied to the gate of the N-type transistor 310, but the bas voltage $V_{BIAS}$ may not be applied thereto. In this case, the bias voltage supply unit 380 and the capacitor 373 for applying the bias voltage $V_{BIAS}$ only to the N-type transistor 310 are unnecessary. However, with this configuration, the P-type transistor 320 and the N-type transistor 310 operate as the inverters, and function as amplifiers only in the vicinity of an inverting voltage. For this reason, it is desirable that the capacitor 373 and the bias voltage supply unit 380 be provided.

As described above, according to the first embodiment of the present technology, because a reference voltage is applied to the non-inverting input terminal of the operational amplifier 352, and the inverting input terminal and the output terminal are connected through the P-type transistor 320, it is possibile to perform virtual short-circuiting between the non-inverting input terminal and the inverting input terminal. As a result, an output voltage $V_{out}$ of the drains of the P-type transistor 320 and the N-type transistor 310 is the same as reference voltage $V_{REF}$ (=$V_{SAT}$). Consequently, the minimum operation voltage can be reduced to $2V_{SAT}$.

[Modified Example]

In the first embodiment described above, the bias voltage supply unit 380 applies the bias voltage $V_{BIAS}$ to the N-type transistor 310 and inputs the faint AC signal at the low level to the P-type transistor 320 to perform amplification thereof. With this configuration, An AC signal at a high level cannot be amplified because the P-type transistor 320 as in an off state. However, with a configuration in which the bias voltage supply unit 380 applies the bias voltage to the P-type transistor 320 and inputs an AC signal to the N-type transistor 310, it is possible to amplify an AC signal at a higher level than the threshold voltage $V_T$ of the N-type transistor 310. The low noise amplifier 300 in the modified example of the first embodiment is different from that in the first embodiment in that the bias voltage is applied to the P-type transistor 320, and the AC signal is input to the N-type transistor 310.

Figure 3:
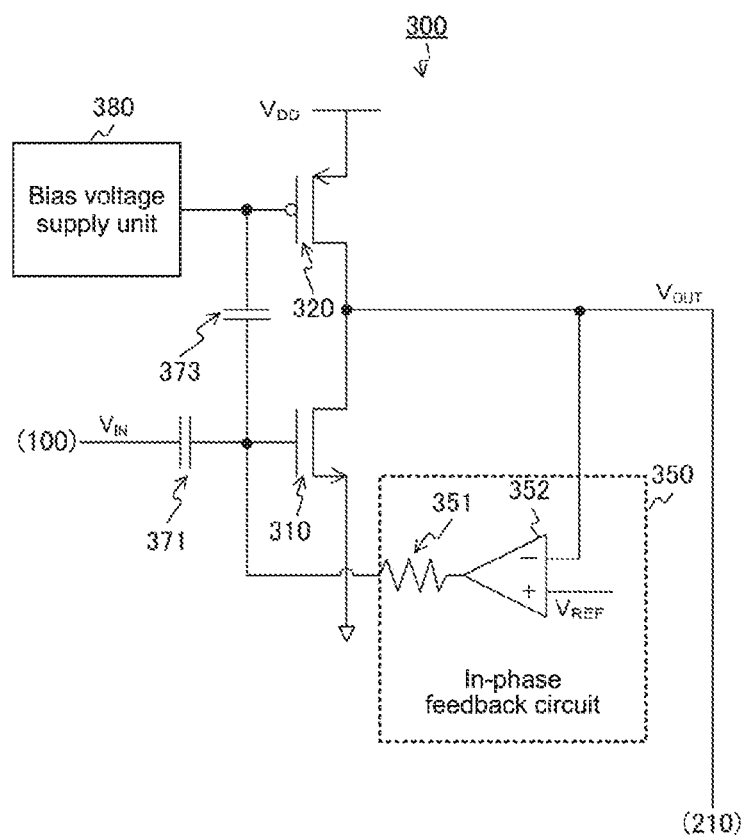
FIG. 3 A circuit diagram showing a configuration example of a low noise amplifier in a modified example of the first embodiment.

FIG. 3 is a circuit diagram showing a configuration example of the low noise amplifier 300 in the modified example of the first embodiment. The bias voltage supply unit 380 in the modified example applies a bias voltage $V_{BIAS}'$ to the gate of the P-type transistor 320 instead of the N-type transistor 310. To the bias voltage $V_{BIAS}'$, a low level of approximately 0 V is set, for example. Further, one end of the resistance 351 in the modified example is connected to the gate of the N-type transistor 310, and one end of the capacitor 371 is connected to the capacitor 373, the gate of the N-type transistor 310, and the resistance 351. Further, the assumption is made that to the gate of the N-type transistor 310 in the modified example, an AC signal at a higher level than the threshold voltage $V_T$ is input.

As described above, according to the modified example of the first embodiment of the present technology, to the gate of the P-type transistor 320, the bias voltage is supplied, and to the N-type transistor 310, the AC signal is input. Therefore, it is possible to amplify the AC signal at a high level instead of the AC signal at a low level. In this way, the low noise amplifier 300 can amplify the AC signal at a high level, and thus the low noise amplifier 300 can be applied to the radio receiver 200 in which the AC signal is assumed to be a high level.

<2. Second Embodiment>

In the first embodiment described above, the bias voltage $V_{BIAS}$ is set to be constant, but the radio receiver 200 may control the bias voltage $V_{BIAS}$ in accordance with a reception level. The radio receiver 200 according to a second embodiment is different from that according to the first embodiment in terms of controlling a value of the bias voltage $V_{BIAS}$ in accordance with the reception level.

Figure 4:
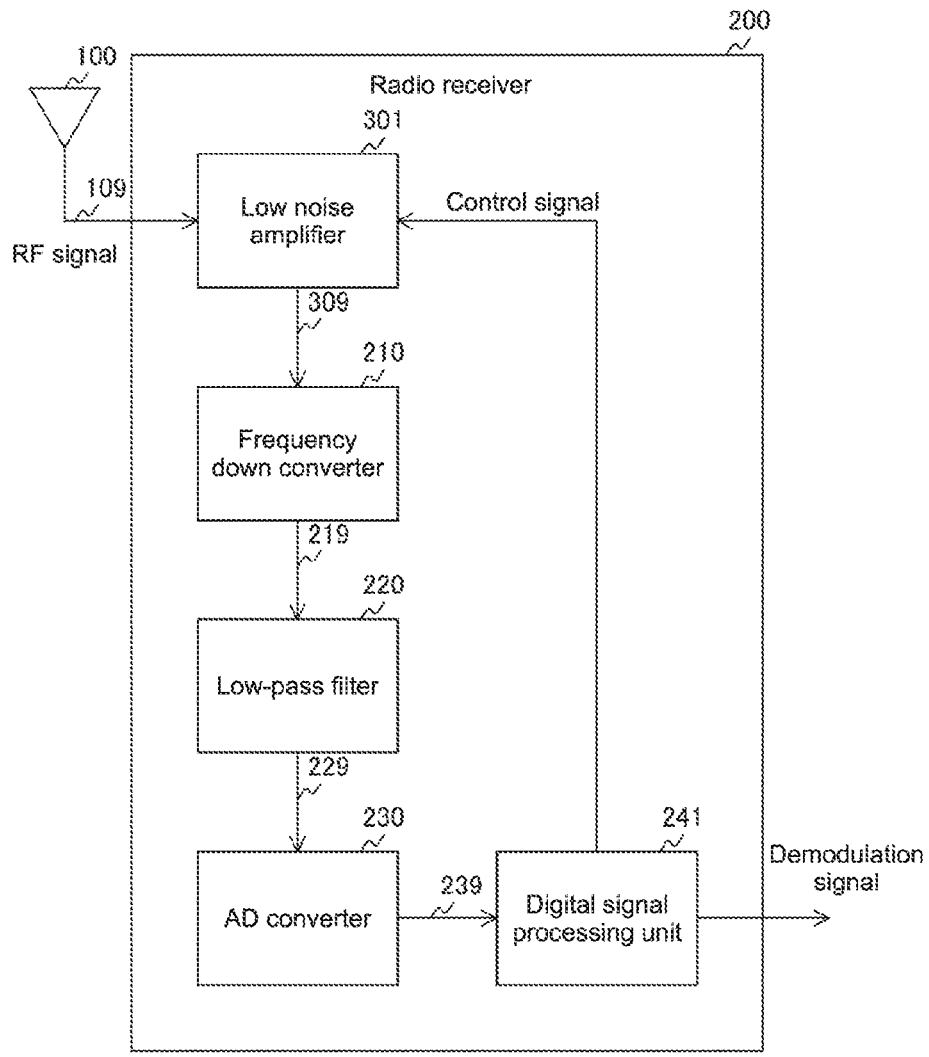
FIG. 4 A block diagram showing a configuration example of a radio receiver in a second embodiment.

FIG. 4 is a block diagram showing a configuration example of the radio receiver 200 in the second embodiment. The radio receiver 200 in the second embodiment is different from that in the first embodiment in terms of being provided with a low noise amplifier 301 and a digital signal processing unit 241 instead of the low noise amplifier 300 and the digital signal processing unit 240.

The digital signal processing unit 241 processes a digital signal and detects a level of the digital signal as a reception level. Then, in accordance with the detected reception level, the digital signal processing unit 241 controls the bias voltage $V_{BIAS}$ in the low noise amplifier 301 with a control signal. For example, in a case where the reception level is higher than a predetermined threshold value Tr, the bias voltage $V_{BIAS}$ is reduced. As a result, although the characteristics of the gain, the noise figure, or the like of the low noise amplifier 301 is lowered, a consumption current of the low noise amplifier 301 can be reduced. On the other hand, the reception level is equal to or lower than threshold value Tr, the digital signal processing unit 241 increases the bias voltage $V_{BIAS}$. As a result, although the consumption current of the low noise amplifier 301 is increased, the characteristics of the gain or the like is improved.

Figure 5:
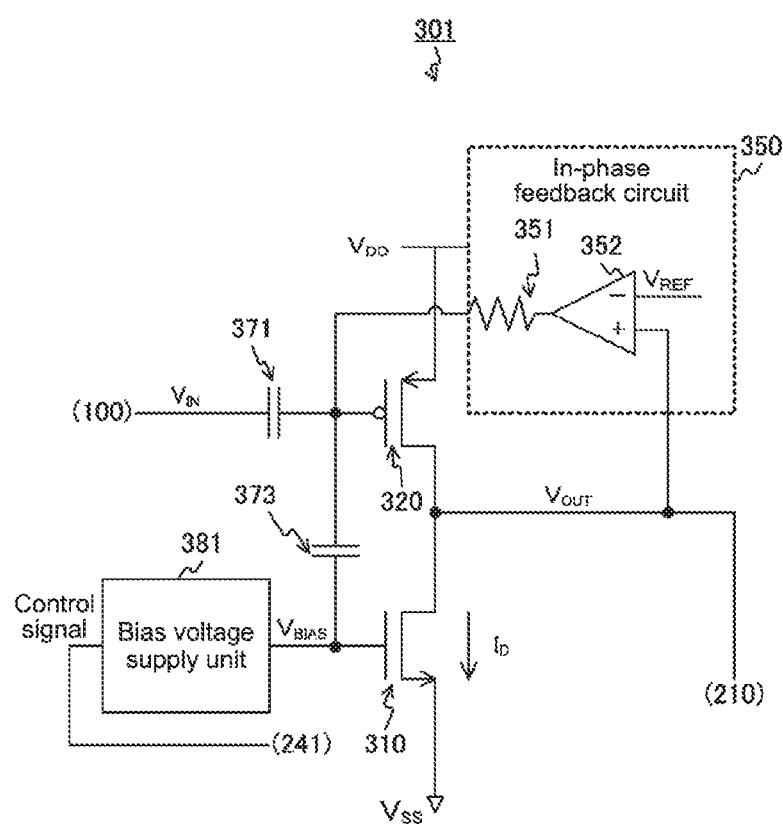
FIG. 5 A circuit diagram showing a configuration example of a low noise amplifier in the second embodiment.

FIG. 5 is a circuit diagram showing a configuration example of the low noise amplifier 301 in the second embodiment. The low noise amplifier 301 is different from that in the first embodiment in terms of being provided with a bias voltage supply unit 381 instead of the bias voltage supply unit 380.

The bias voltage supply unit 381 is different from the bias voltage supply unit 380 in the first embodiment in terms of supplying a bias voltage $V_{BIAS}$ of a value indicated by a control signal from the digital signal processing unit 241.

Figure 6:
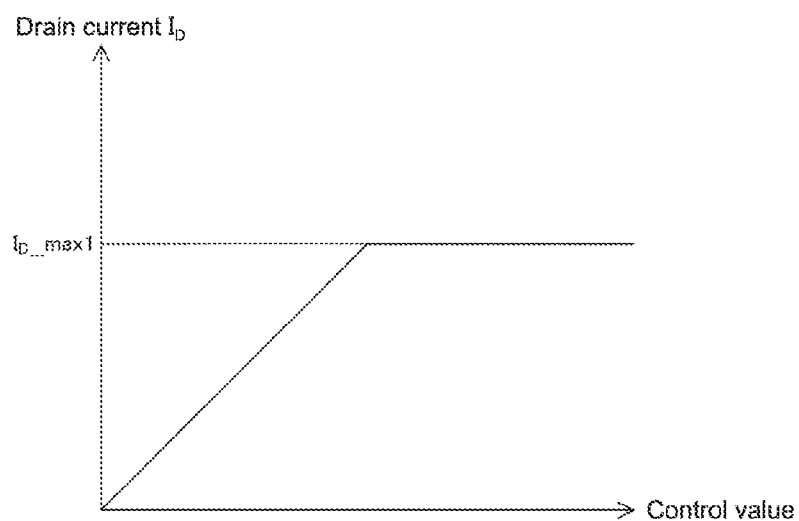
FIG. 6 A graph showing an example of a drain current for each control value is the second embodiment.

FIG. 6 is a graph showing an example of a drain current for each control value in the second embodiment. A vertical axis in the figure indicates a drain current $I_D$ of the N-type transistor 310, and a horizontal axis indicates a control value indicated by a control signal. As exemplified in the figure, by the control value, the drain current $I_D$ is controlled within a range of 0 to $I_{D\_max1}$.

The drain current $I_D$ cannot be set to be larger than $I_{D\_max1}$ as described above, because a current discharge capacitance of the P-type transistor 320 is generally less than that of the N-type transistor 310 under a condition of the same gate width and the same gate length.

It should be noted that, by increasing the gate width of the P-type transistor 320, a maximum value of the drain current can be increased, but this is not desirable because increasing the gate width deteriorates the gain and noise characteristic at high frequencies. Further, the gate length of the P-type transistor 320 is generally set to be a minimum value acceptable by a manufacture process because of a high frequency operation generally. For this reason, the gate length thereof is difficult to be reduced.

Figure 7:
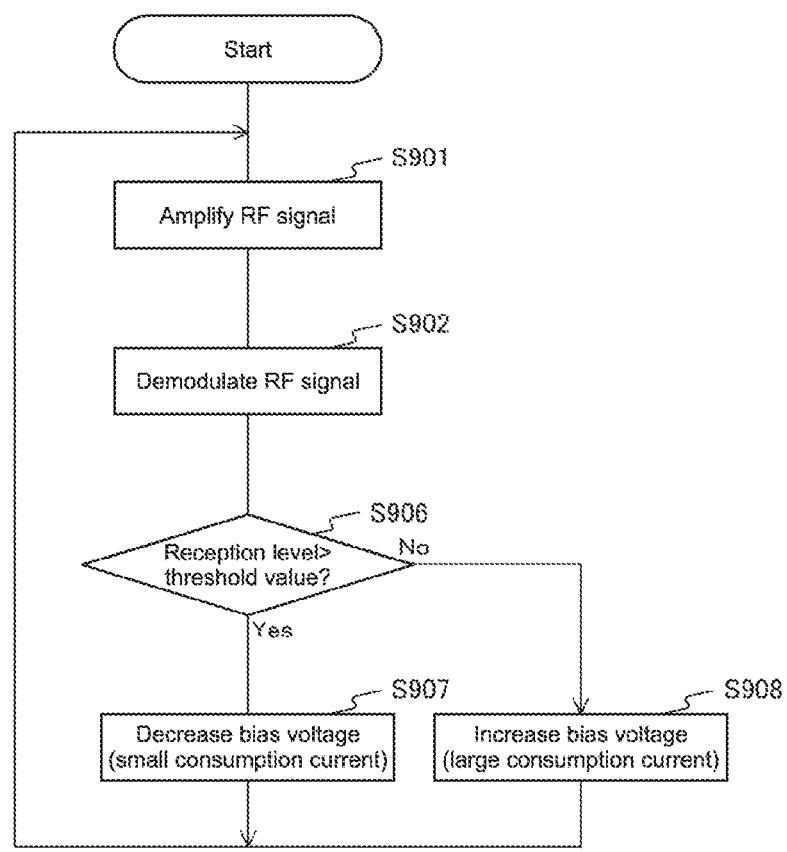

FIG. 7 is a flowchart showing an example of an operation of the radio receiver 200 in the second embodiment. This operation is started when the radio receiver 200 is powered on, for example.

The radio receiver 200 amplifies an RF signal (Step S901) and demodulates the RF signal (Step S902). Further, the radio receiver 200 detects a reception level and determines whether the value is higher than the threshold value Tr or not (Step S906). In a case where the reception level is higher than the threshold value Tr (Step S906: Yes), the radio receiver 200 reduces the bias voltage $V_{BIAS}$ to V1 to set a consumption current to be small (Step S907). On the other hand, in a case where the reception level is equal to or less than the threshold value Tr (Step S906: No), the radio receiver 200 increases the bias voltage $V_{BIAS}$ to V2, which is higher than V1 to increase the consumption current (Step S908). After Step S907 or Step S908, the radio receiver 200 repeatedly performs Step S901 and subsequent steps.

It should be noted that the radio receiver 200 controls the bias voltage between the two states of V1 and V2 depending on whether the reception level is higher than the threshold value Tr or not, but the configuration is not limited to this. For example, a plurality of threshold values may be set, and the radio receiver 200 may control the bias voltage to a lower value, as the reception level becomes higher.

As described above, according to the second embodiment of the present technology, the radio receiver 200 controls the bias voltage in accordance with the reception level. Therefore, it is possible to adjust a balance between the characteristics of the gain and the noise figure and the power consumption in accordance with the reception level.

[Modified Example]

In the second embodiment described above, the digital signal processing unit 241 in the radio receiver 200 controls the bias voltage $V_{BIAS}$, but an external apparatus of the radio receiver 200 may control the bias voltage $V_{BIAS}$. The radio receiver 200 in a modified example of the second embodiment is different from that in the second embodiment in terms of changing the bias voltage $V_{BIAS}$ by being controlled by an external apparatus.

FIG. 8 is a block diagram showing a configuration example of the radio receiver 200 in the modified example of the second embodiment. The radio receiver 200 in the modified example is different from that in the second embodiment in terms of being provided with the digital signal processing unit 240 instead of the digital signal processing unit 241.

The digital signal processing unit 240 in the second embodiment supplies a demodulation signal to an electronic apparatus 400 provided outside the radio receiver 200.

The electronic apparatus 400 detects a level of the demodulation signal as the reception level, and controls bias voltage $V_{BIAS}$ by a control signal on a basis of the reception level.

As described above, according to the modified example of the second embodiment of the present technology, instead of the digital signal processing unit 240, the electronic apparatus 400 controls the bias voltage $V_{BIAS}$, so the bias voltage $V_{BIAS}$ can be set to a value corresponding to the reception level detected by the electronic apparatus 400.

<3. Third Embodiment>

In the second embodiment described above, the radio receiver 200 controls the drain current. $I_D$ of the N-type transistor 310. As long as the gate width or the gate length of the P-type transistor 320 is not changed, the drain current $I_D$ does not become larger than the certain value $I_D$_max1. However, when an auxiliary current source that supplies a predetermined current as an auxiliary current is provided to the drain of the N-type transistor 310, it is possible to increase a maximum value of the drain current $I_D$ (in other words, increase a control range) without deteriorating the characteristics. The low noise amplifier 301 in a third embodiment is different from that in the second embodiment in terms of increasing the control range of the drain current $I_D$ with an auxiliary current source.

FIG. 9 is a circuit diagram showing a configuration example of the low noise amplifier 301 in the third embodiment. The low noise amplifier 301 in the third embodiment is different from that in the second embodiment in terms of being further provided with an auxiliary current source 330.

The auxiliary current source 330 supplies a predetermined auxiliary current from the power supply terminal to the drain of the N-type transistor 310. The auxiliary current source 330 is achieved by a P-type transistor or the like, for example. It should be noted that the auxiliary current source 330 is an example of a current source described in the claims.

Even in a case where the auxiliary current source 330 is provided, the gain is not lowered, and the noise figure is improved. This will be described in detail in a fourth embodiment.

FIG. 10 is a graph showing an example of the drain current for each control value in the third embodiment. A vertical axis in the figure indicates the drain current $I_D$ of the N-type transistor 310, and a horizontal axis indicates a control value indicated by a control signal. Further, $I_D$_max1 is a maximum value of the drain current $I_D$ in a case where the auxiliary current source 330 is not provided. As exemplified in the figure, by providing the auxiliary current source 330, the drain current $I_D$ can be controlled to be a value larger than $I_D$_max1.

As described above, according to the third embodiment of the present technology, the auxiliary current source 330 supplies the auxiliary current to the drain of the N-type transistor 310 and the P-type transistor 320, so the control range of the drain current can he increased.

[Modified Example]

In the third embodiment described above, the bias voltage supply unit 381 applies the bias voltage $V_{BIAS}$ to the N-type transistor 310, and inputs a faint AC signal at a low level to the P-type transistor 320 and amplifies the signal. With this configuration, an AC signal at a high level cannot he amplified because the P-type transistor 320 is in the off state. However, with such a configuration that the bias voltage supply unit 381 applies the bias voltage to the P-type transistor 320 and inputs the AC signal to the N-type transistor 310, it is possible to amplify an AC signal at a high level, which is higher than the threshold voltage $V_T$ of the N-type transistor 310. The bias voltage may be applied to the P-type transistor 320. The low noise amplifier 300 in the modified example of the third embodiment is different from that in the third embodiment in terms of applying the bias voltage V to the P-type transistor 320 and inputting the AC signal to the N-type transistor 310.

FIG. 11 is a circuit diagram showing a configuration example of the low noise amplifier 301 in the modified example of the third embodiment. The bias voltage supply unit 380 in the modified example applies a bias voltage $V_{BIAS}'$ to the gate of the P-type transistor 320 instead of the N-type transistor 310. Further, one end of the resistance 351 in the modified example is connected to the gate of the N-type transistor 310, and one end of the capacitor 371 is connected to the capacitor 373, the gate of the N-type transistor 310, and the resistance 351. Further, the auxiliary current source 330 in the modified example supplies the auxiliary current from a ground terminal to the source of the P-type transistor 320.

As described above, according to the modified example of the third embodiment of the present technology, to the gate of the P-type transistor 320, the bias voltage is supplied, and to the N-type transistor 310, the AC signal is input. Thus, it is possible to amplify the AC signal at a high level instead of the AC signal at a low level. In this way, the low noise amplifier 300 can amplify the AC signal at a high level, so the low noise amplifier 300 can be applied to the radio receiver 200 in which the AC signal is expected to be a high level.

<4. Fourth Embodiment>

In the third embodiment, the auxiliary current source 330 improves the characteristics of the noise figure and the like. By providing a low-pass filter, the characteristics can be further improved. Further, in a viewpoint of improvement of transmission efficiency, it is desirable that impedances on a transmission side and on a reception side be matched. The low noise amplifier 301 in a fourth embodiment is different from that in the third embodiment in that a low-pass filter and an impedance matching circuit are further provided.

FIG. 12 is a circuit diagram showing a configuration example of the low noise amplifier 301 in the fourth embodiment. The low noise amplifier 301 in the fourth embodiment is different from that in the third embodiment in terms of being further provided with an impedance matching circuit 372 and a low-pass filter 360. The lowpass filter 360 is provided with a capacitor 361 and a resistance 362. Further, the auxiliary current source 330 in the fourth embodiment is provided with a P-type transistor 331. As the P-type transistor 331, for example, a MOS transistor is used.

The impedance matching circuit 372 is inserted between the capacitor 371 and the gate of the P-type transistor 320. One end of the capacitor 361 is connected to the power supply terminal, and the other end thereof is connected to the resistance 362 and the gate of the P-type transistor 331. One end of the resistance 362 is connected to the capacitor 361 and the gate of the P-type transistor 331, and the other end thereof is connected to the resistance 351 and the output terminal of the operational amplifier 352. The source of the P-type transistor 331 is connected to the power supply terminal, and the drain thereof is connected to the drain of the N-type transistor 310 and the P-type transistor 320 and the non-inverting input terminal (+) of the operational amplifier 352. Further, the gate of the P-type transistor 331 is connected to the capacitor 361 and the resistance 362.

The impedance matching circuit 372 causes impedances of circuits of the transmission side and the reception side on a transmission path for transmitting the RF signal to be matched. As a result, it is possible to minimize a reflection loss and improves transmission efficiency.

The low-pass filter 360 supplies only a DC bias voltage to the gate terminal of the P-type transistor 331. A cutoff frequency of the low-pass filter 360 is set to a value sufficiently small with respect to a signal component bandwidth. Further, by connecting the low-pass filter 360 to the gate of the P-type transistor 331, the P-type transistor 331 does not contribute to signal amplification but functions only as a DC current source. As a result, it is possible to suppress oscillations or the like and thus cause the low noise amplifier 301 to stably operate.

Here, description will be given on an effect of improving the characteristics by the auxiliary current source 330. The assumption is made that a ratio of channel widths of the -type transistor 320 and the P-type transistor 331, is set to 1: a, for example. Here, a is a value that satisfies the following expression.

$$0 < a < 1 \quad \text{expression 7}$$

In a case where the ratio of the channel widths is 1: a, the drain current $I_{D2}$ (that is, auxiliary current) of the P-type transistor 320 is expressed by the following expression, for example. A unit of the drain current $I_{D2}$ is ampere (A), for example.

$$I_{D2} = I_D * \{1/(1+a)\} \quad \text{expression 8}$$

In the above expression, $I_D$ is the drain current of the N-type transistor 310, and a unit thereof is ampere (A), for example.

Further, a transconductance $g_{m2}$ and an output resistance $r_{o2}$ of the P-type transistor 320 is expressed by the following expression, for example. A unit of the transconductance $g_{m2}$ is siemens (S), for example. A unit of the output resistance $r_{o2}$ is ohm (Ω), for example.

$$g_{m2} = \{(K_p \cdot I_D)/(1+a)\}^{1/2} \quad \text{expression 9}$$

$$K_p = \mu_p \cdot C_{ox} \cdot (W/L) \quad \text{expression 10}$$

[Mathematical 1]

$$r_{02} = \frac{1+a}{\lambda_p \cdot I_D} \quad \text{expression 11}$$

In the expression 10, $\mu_p$ is a carrier mobility in the P-type transistor 320, and a unit thereof is m²/V·s, for example. $C_{ox}$ is a gate capacitance corresponding to a thickness of a gate oxide film, and a unit thereof is farad (F), for example. W is a gate width, and t is a gate length. A unit of W and L is meter (m), for example. In expression 11, gamma is a channel length modulation coefficient.

As exemplified in the expression 8, when a current of the P-type transistor 320 is divided into the auxiliary current source 330, the gain of the P-type transistor 320 is superficially lowered, but is not lowered in actuality. As exemplified in the expression 9, the transconductance $g_{m2}$ of the P-type transistor 320 is inversely proportional to a square root of a division ratio (1+a), and as exemplified in the expression 11, the output resistance $r_{o2}$ is proportional to the division ratio (1+a). Thus, the gain as a product is increased in proportional to a square root of the division ratio (1+a) as expressed in the following expression. Thus, even if the auxiliary current source 330 is connected, lowering the gain of the low noise amplifier 300 is not caused.

[Mathematical 2]

$$g_{m2}r_{o2} = \sqrt{\frac{K_p \cdot (W/L) \cdot (1+a)}{\lambda_p^2 \cdot I_D}} \quad \text{expression 12}$$

Further, the noise figure will be studied. Generally, a noise figure NF is expressed by the following expression.

$$NF = SNR_{in}/SNR_{out} \quad \text{expression 13}$$

In the above expression, $SNR_{in}$ is a S/N ratio of an input signal, and $SNR_{out}$ is a S/N ratio of an output signal. The S/N ratios can be obtained by the following expression.

[Mathematical 3]

$$SNR_{in} = \frac{\text{Signal power}}{\text{Input noise}} = \frac{\overline{V_{in}^2}}{\overline{V_s^2}} \quad \text{expression 14}$$

[Mathematical 4]

$$SNR_{out} = \frac{\overline{V_{in}^2} G^2}{\overline{V_x^2} G^2 + \overline{V_n^2}} \quad \text{expression 15}$$

In the expression 15, G is a voltage gain. Further, $V_n^2$ with an overline indicates a noise generated by the low noise amplifier 300. With the use of the expression 14 and the expression 15, the expression 13 can be deformed into the following expression.

[Mathematical 5]

$$NF = \frac{\overline{V_s^2} G^2 + \overline{V_n^2}}{\overline{V_s^2} G^2}$$

$$= 1 + \frac{\overline{V_n^2}}{\overline{V_s^2} G^2} \quad \text{expression 16}$$

Further, when input matching is achieved by the impedance matching circuit 372, the voltage gain G of the low noise amplifier 301 is expressed by the following expression.

$$G = R_{in}(g_{m1}+g_{m2})r_{o1} \cdot r_{o2}/\{(R_s+R_{in}) \cdot (r_{o1}+r_{o2})\} = (g_{m1}+g_{m2})r_{o1} \cdot r_{o2}/\{2(r_{o1}+r_{o2})\} \quad \text{expression 17}$$

In the above expression, $R_{in}$ is a resistance on an input side of the impedance matching circuit 372. $g_{m1}$ is a transconductance of the N-type transistor 310, and a unit thereof is siemens (S), for example. $R_s$ is a resistance of a signal source of the input signal, and a unit thereof is ohm (Ω), for example. The resistance values thereof are the same, for example.

Subsequently, when the assumption is made that the impedance matching circuit 372 converts into n-times resistance (n is a real number), the input noise is expressed by the following expression.

[Mathematical 6]

$$\overline{V_s^2} = 4kTnR_s \qquad \text{expression 18}$$

In the above expression, k is a Boltzmann constant. T is an absolute temperature, and a unit thereof is Kelvin (K), for example.

Further, channel thermal noise currents generated by the N-type transistor 310, the P-type transistor 320, and the P-type transistor 331, respectively, are expressed by the following expression.

[Mathematical 7]

$$\overline{I_{M1}^2} = 4kT\gamma g_{m1} \qquad \text{expression 19}$$

[Mathematical 8]

$$\overline{I_{M2}^2} = 4kT\gamma g_{m2} \qquad \text{expression 20}$$

[Mathematical 9]

$$\overline{I_{m3}^2} = 4kT\gamma g_{m3} \qquad \text{expression 21}$$

In the expression 19 to expression 21, gamma is a channel thermal noise coefficient. Further, a left side of the expression 19 indicates the channel thermal noise current of the N-type transistor 310, and a left side of the expression 20 indicates the channel thermal noise current of the P-type transistor 320. A left side of the expression 21 indicates the channel thermal noise current of the P-type transistor 331. Further, in the expression 21, $g_{m3}$ is a transconductance of the P-type transistor 331, and a unit thereof is, for example, siemens (S).

The assumption is made that only the channel thermal noise exemplified in the expression 19 to the expression 21 is generated as a noise. A noise generated by the low noise amplifier 301 is expressed by the following expression obtained by multiplying a sum of the expression 19 to the expression 21 by an output resistance.

[Mathematical 10]

$$\overline{V_n^2} = \left(\overline{I_{M1}^2} + \overline{I_{M2}^2} + \overline{I_{M3}^2}\right)\left(\frac{r_{o1}r_{o2}}{r_{o1}+r_{o2}}\right)^2 \qquad \text{expression 22}$$

$$= 4kT\gamma(g_{m1} + g_{m2} + g_{m3})\left(\frac{r_{o1}r_{o2}}{r_{o1}+r_{o2}}\right)^2$$

When the expression 17, the expression 18, and the expression 22 are assigned to the expression 16 to organize those, the following expression can be obtained.

[Mathematical 11]

$$NF = 1 + 2\cdot\gamma\cdot\frac{g_{m1} + g_{m2} + g_{m3}}{n\cdot R_s\cdot(g_{m1}+g_{m2})^2} \qquad \text{expression 23}$$

Here, by a square-root low of the MOS transistor, from device sizes of the P-type transistor 320, the N-type transistor 310, and the P-type transistor 331 and current values thereof, transconductances of the devices are determined. For example, transconductance $g_{m1}$, $g_{m2}$, and $g_{m3}$ of the P-type transistor 320, the N-type transistor 310, and the P-type transistor 331, respectively, are obtained from the following expression.

$$g_{m1} = (U_n\cdot C_{ox}(W/L)\cdot I_D)^{1/2} = (K_n\cdot I_D)^{1/2} \qquad \text{expression 24}$$

$$g_{m2} = \{(U_p\cdot C_{ox}(W/L)\cdot I_D/(1+a)\}^{1/2} = \{K_p\cdot I_D/(1+a)\}^{1/2} \qquad \text{expression 25}$$

$$g_{m3} = \{(U_p\cdot C_{ox}(aW/L)\cdot I_D\cdot a(1+a)\}^{1/2} = \{K_p\cdot I_D\cdot a^2/(1+a)\}^{1/2} \qquad \text{expression 26}$$

When the expression 24, the expression 25, and the expression 26 are assigned to the expression 23 to organize those, the following expression can be obtained.

[Mathematical 12]

$$NF = 1 + 2\cdot\gamma\cdot\frac{\sqrt{K_n} + \sqrt{K_p\cdot\left(\frac{1}{1+a}\right)} + \sqrt{K_p\cdot\left(\frac{a^2}{1+a}\right)}}{n\cdot R_s\cdot\sqrt{I_D}\cdot\left(\sqrt{K_n} + \sqrt{K_p\cdot\left(\frac{1}{1+a}\right)}\right)^2} \qquad \text{expression 27}$$

In the above expression, a third term of a numerator indicates a noise increment by the auxiliary current source 330, but because a<1 is satisfied from the expression 7. Therefore, as compared to a first term and a second term of the numerator, the term makes a smaller contribution to the noise. Further, as exemplified in the above expression, the noise figure NF is decreased in inversely proportion to the square root of the operation current ($I_D$). Therefore, normally, an effect of improvement of the noise figure because of an increase of $I_D$ by the auxiliary current source 330 becomes larger.

It should be noted that, in the fourth embodiment, the bias voltage supply unit 380 applies the bias voltage $V_{BIAS}$ to the N-type transistor 310, but may apply the bias voltage to the P-type transistor 320.

Further, the impedance matching circuit 372 and the low-pass filter 360 are provided, but only one of those may be provided.

As described above, according to the fourth embodiment of the present technology, because the low-pass filter 360 supplies only the DC bias voltage to the gate terminal of the P-type transistor 331, the P-type transistor 331 can be caused to function as only the DC current source. Further, because the impedance matching circuit 372 performs impedance matching, the transmission efficiency can be improved.

[First Modified Example]

In the fourth embodiment described above, by the auxiliary current source 330, the drain current $I_D$ is increased, but the capacitance between the output terminal 308 and the power supply terminal is increased by an amount corresponding to the capacitance of auxiliary current source 330. If the capacitance is increased, a cutoff frequency of a low-pass filter constituted of a capacitance thereof and a resistance is lowered, and a bandwidth of a frequency that passes through the filter is narrowed. As a result, it is difficult to amplify a high frequency component. Thus, it is desirable that the capacitance be adjusted so as not to deteriorate the characteristics by inserting a cascode transistor device such as the N-type transistor. The low noise amplifier 301 in the first modified example of the fourth embodiment is different from that in the fourth embodiment in terms of being further provided with the cascode transistor device.

FIG. 13 a circuit diagram showing a configuration example of the low noise amplifier 301 in the first modified example of the fourth embodiment. The low noise amplifier 301 in the first modified example is different from that in the fourth embodiment in terms of being further provided with an N-type transistor 340. As the N-type transistor 340, for example, a MOS transistor is used.

A gate of the N-type transistor 340 is connected to the bias voltage supply unit 381, and a drain thereof is connected to the drain of the P-type transistor 320 and the non-inverting input terminal (+) of the operational amplifier 352. Further, a source of the N-type transistor 340 is connected to the drain of the N-type transistor 310 and the drain of the P-type transistor 331. It should be noted that, the N-type transistor 340 is an example of a cascode transistor device described in the claims.

As described above, between the auxiliary current source 330 connected to the power supply terminal and the drain of the P-type transistor 320, the N-type transistor 340 is inserted. The drain thereof is connected to the output terminal 308. Therefore, as compared to a case where only the auxiliary current source 330 is provided, the capacitance between the power supply terminal and the output terminal 308 is reduced.

FIG. 14 is a circuit diagram showing a configuration example of the bias voltage supply unit 381 in the first modified example of the fourth embodiment. The bias voltage supply unit 381 is provided with reference current sources 382 and 383, N-type transistors 384, 385, and 386, capacitors 387 and 388, and a resistance 389. As the N-type transistors 384, 385, and 386, for example, a MOS transistor is used.

A gate and a drain of the N-type transistor 384 are connected to the reference current source 382, gates of the N-type transistors 385 and 340, and the capacitor 387, and a source thereof is connected to a ground terminal.

The gate of the N-type transistor 385 is connected to the reference current source 382, the N-type transistors 384 and 340, and the capacitor 387, a source thereof is connected to the ground terminal, and a drain thereof is connected to the reference current source 383, the capacitor 388, and the resistance 389.

A gate of the N-type transistor 386 is connected to the capacitor 388, the resistance 389, and the reference current source 383, a source thereof is connected to the ground terminal, and a drain thereof is connected to the source of the N-type transistor 385.

One end of the capacitor 387 is connected to the N-type transistors 384, 385, and 340 and the reference current source 382, and the other end is connected to the ground terminal. One end of the capacitor 388 is connected to the N-type transistors 385 and 386, the reference current source 383, and the resistance 389, and the other end thereof is connected to the ground terminal.

One end of the resistance 389 is connected to the N-type transistors 385 and 386, the reference current source 383, and the capacitor 388, and the other end thereof is connected to the N-type transistor 310.

In accordance with a control signal from the digital signal processing unit 241, the reference current source 382 supplies a reference current $I_{REF1}$ to the N-type transistor 385 or the like. In accordance with a control signal from the digital signal processing unit 241, the reference current source 383 supplies a reference current $I_{REF2}$ to the N-type transistor 386 or the like.

With the configuration described above, a circuit including the N-type transistors 384 and 385 functions as a current mirror circuit. Further, the digital signal processing unit 241 controls the reference currents ($I_{REF1}$ and $I_{REF2}$) with the control signals, and thus can set the operation current ($I_D$) in accordance with the reception level.

As described above, according to the first modified example of the fourth embodiment of the present technology, because between the auxiliary current source 330 and the drain of the P-type transistor 320, the N-type transistor 340 is inserted, it is possible to suppress an increase in the capacitance between the power supply terminal and the output terminal. As a result, the bandwidth of a frequency that passes through the filter constituted of the capacitance and resistance becomes larger, and the low noise amplifier 301 can easily amplify a high frequency component.

[Second Modified Example]

In the fourth embodiment described above, the auxiliary current source 330 always supplies the auxiliary current after the power is turned on. However, in a case where the P-type transistor 320 is in an off state, amplification by the P-type transistor 320 is not performed, so a necessity of supplying the auxiliary current is weak. For this reason, in a viewpoint of saving the consumption current, only in a case where the gate of the P-type transistor 320 is at a low level (that is, the P-type transistor 320 is in an on state), the auxiliary current is desirably supplied. The low noise amplifier 301 in the second modified example in the fourth embodiment is different from that in the fourth embodiment in that the auxiliary current is supplied in a case where the gate of the P-type transistor 320 is at the low level.

FIG. 15 is a circuit diagram showing a configuration example of the low noise amplifier 301 in the second modified example in the fourth embodiment. The low noise amplifier 301 in the second modified example is different from the fourth embodiment in terms of being further provided with a comparator 390.

An inverting input terminal (−) of the comparator 390 is connected to an output terminal of the operational amplifier 352 and the resistance 351. To a non-inverting input terminal (+) thereof, a predetermined reference voltage $V_{REF2}$ is applied, and an output terminal thereof is connected to the resistance 362. The reference voltage $V_{REF2}$ is set to the low level around 0 (V), for example. Further, one end of the resistance 362 in the second modified example is not connected to the resistance 351 and the operational amplifier 352 but is connected to only the comparator 390.

In the operational amplifier 352, due to variations of processes, voltages, temperatures, or the like, characteristics (threshold voltage and the like) of the transistor in the operational amplifier 352 may be changed, and an output terminal may be at a high level. In this case, a potential of the gate of the P-type transistor 320 connected to the output terminal becomes a high level, and the P-type transistor 320 is brought into the off state.

In view of this, the comparator 390 compares a voltage of the output terminal (that is, the gate of the P-type transistor 320) of the operational amplifier 352 and the reference voltage $V_{REF2}$, and supplies a comparison result to the auxiliary current source 330. Then, on a basis of the comparison result, the auxiliary current source 330 supplies the auxiliary current. For example, in a case where the gate of the P-type transistor 320 is at a higher level than the reference voltage $V_{REF2}$, the comparator 390 outputs the high level to the auxiliary current source 330, and the auxiliary current source 330 stops supplying the auxiliary current. On the other hand, in a case where the gate of the P-type transistor 320 is at a low level, which is equal to or less than the reference voltage $V_{REF2}$, the comparator 390 outputs the low level to the auxiliary current source 330, and the auxiliary current source 330 supplies the auxiliary current.

It should be noted that, in the first modified example, only the N-type transistor 340 is additionally provided to the low noise amplifier 301 in the fourth embodiment, and in the second modified example, only the comparator 390 is additionally provided thereto. However, both of those may be additionally provided to the low noise amplifier 301 in the fourth embodiment.

As described above, according to the second modified example of the fourth embodiment of the present technology, in a case where the gate of the P-type transistor 320 is at the low level, the auxiliary current source 330 supplies the auxiliary current, so the auxiliary current can be supplied only in a case where the P-type transistor 320 is in the on state. As a result, in a case where the P-type transistor 320 is in the off state, the auxiliary current is not supplied. Thus, the consumption current can be reduced.

It should be noted that the above embodiments are an example for embodying the present technology, matters in the embodiments and matters specifying the invention in the claims have correspondence relationship, respectively. In the same way, the matters specifying the invention in the claims and matters in the embodiments of the present technology which have the same names have correspondence relationship, respectively. However, the present technology is not limited to the embodiments and can be further embodied by performing various modifications for the embodiments without departing from the gist thereof.

Further, the process steps described in the above embodiments may be grasped as a method having the series of steps, and may be grasped as a program for causing a computer to execute the series of steps or a recording medium for storing the program. As the recording medium, for example, a CD (Compact Disc), an MD (Mini Disc), a DVD (Digital Versatile Disc), a memory card, a Blu-ray (registered trademark) Disc, or the like can be used.

It should be noted that effects described here are not particularly limited, and any effect described in this disclosure may be obtained.

It should be noted that, the present technology can take the following configuration.

(1) An amplifier, including:
a P-type transistor and an N-type transistor connected in series; and
an operational amplifier, in which
an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal.

(2) The amplifier according to (1), further including:
a bias voltage supply unit that supplies a predetermined bias voltage to the gate of one of the P-type transistor and the N-type transistor; and
a capacitor inserted between the gate of the P-type transistor and the gate of the N-type transistor.

(3) The amplifier according to (1) or (2), further including:
a current source connected to the drain.

(4) The amplifier according to (3), further including:
a cascode transistor device inserted between the drain and the current source.

(5) The amplifier according to (3) or (4), further including:
a comparator that compares a potential of the gate and a predetermined potential and supplies a result of the comparison, in which
the current source supplies the predetermined current on a basis of the comparison result of the comparator.

(6) The amplifier according to any one of (3) to (5), further including:
a low-pass filter, in which
the current source includes a transistor, and
the low-pass filter supplies a DC bias voltage to a gate terminal of the transistor.

(7) The amplifier according to any one of (1) to (6), further including:
an impedance matching circuit that causes impedances of circuits on both ends of a transmission channel connected to the amplifier to match with each other.

(8) The amplifier according to any one of (1) to (7), in which
the predetermined reference voltage is a value equal to or more than a saturation drain voltage of one of the P-type transistor and the N-type transistor.

(9) An electronic circuit, including:
an amplifier including a P-type transistor and an N-type transistor connected in series and an operational amplifier, in which an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal; and
a signal processing unit that processes a signal output from the drain.

(10) The electronic circuit according to (9), further including:
a bias voltage supply unit that supplies a bias voltage having a value indicated by a control signal to the gate of one of the P-type transistor and the N-type transistor; and
a capacitor inserted between the gate of the P-type transistor and the gate of the N-type transistor.

(11) The electronic circuit according to (10), in which
the signal processing unit processes a signal output from the drain and generates the control signal on a basis of a level of the signal.

REFERENCE SIGNS LIST

100 antenna
200 radio receiver
210 frequency down converter
220 low-pass filter
230 AD converter
240, 241 digital signal processing unit
300, 301 low noise amplifier
310, 340, 384, 385, 386 N-type transistor
320, 331 P-type transistor
330 auxiliary current source
350 in-phase feedback circuit 351, 362, 389 resistance
352 operational amplifier
360 low-pass filter
361, 371, 373, 387, 388 capacitor
372 impedance matching circuit
380, 381 bias voltage supply unit
382, 383 reference currents source
390 comparator
400 electronic apparatus

The invention claimed is:

1. An amplifier, comprising:
a P-type transistor and an N-type transistor connected in series;
an operational amplifier, wherein
an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal;
a bias voltage supply unit that supplies a predetermined bias voltage to the gate of one of the P-type transistor and the N-type transistor; and
a capacitor inserted between the gate of the P-type transistor and the gate of the N-type transistor.

2. The amplifier according to claim 1, further comprising:
a current source connected to the drain.

3. The amplifier according to claim 2, further comprising:
a comparator that compares a potential of the gate and a predetermined potential and supplies a result of the comparison, wherein
the current source supplies the predetermined current on a basis of the comparison result of the comparator.

4. The amplifier according to claim 2, further comprising:
a low-pass filter, wherein
the current source includes a transistor, and
the low-pass filter supplies a DC bias voltage to a gate terminal of the transistor.

5. The amplifier according to claim 1, further comprising:
an impedance matching circuit that causes impedances of circuits on both ends of a transmission channel connected to the amplifier to match with each other.

6. The amplifier according to claim 1, wherein
the predetermined reference voltage is a value equal to or more than a saturation drain voltage of one of the P-type transistor and the N-type transistor.

7. An amplifier, comprising:
a P-type transistor and an N-type transistor connected in series;
an operational amplifier, wherein
an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal;
a current source connected to the drain; and
a cascode transistor device inserted between the drain and the current source.

8. An electronic circuit, comprising:
an amplifier including a P-type transistor and an N-type transistor connected in series and an operational amplifier, in which an output terminal of the operational amplifier is connected to gates of both the P-type transistor and the N-type transistor, one of an inverting input terminal and a non-inverting input terminal of the operational amplifier is connected to drains of both the P-type transistor and the N-type transistor, and a predetermined reference voltage is applied to another of the inverting input terminal and the non-inverting input terminal;
a signal processing unit that processes a signal output from the drain;
a bias voltage supply unit that supplies a bias voltage having a value indicated by a control signal to the gate of one of the P-type transistor and the N-type transistor; and
a capacitor inserted between the gate of the P-type transistor and the gate of the N-type transistor.

9. The electronic circuit according to claim 8, wherein
the signal processing unit processes a signal output from the drain and generates the control signal on a basis of a level of the signal.

* * * * *